United States Patent
Park et al.

(10) Patent No.: US 11,995,544 B2
(45) Date of Patent: May 28, 2024

(54) APERTURE RATIO MEASUREMENT DEVICE AND DETERIORATION COMPENSATION SYSTEM OF DISPLAY DEVICE INCLUDING THE SAME

(71) Applicant: SAMSUNG DISPLAY CO., LTD., Yongin-si (KR)

(72) Inventors: Kyong Tae Park, Yongin-si (KR); Dong Hoon Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 579 days.

(21) Appl. No.: 17/317,740

(22) Filed: May 11, 2021

(65) Prior Publication Data

US 2021/0390683 A1  Dec. 16, 2021

(30) Foreign Application Priority Data

Jun. 10, 2020  (KR) .......................... 10-2020-0070440

(51) Int. Cl.
*G06N 3/08* (2023.01)
*G06F 18/21* (2023.01)
(Continued)

(52) U.S. Cl.
CPC ............. *G06N 3/08* (2013.01); *G06F 18/217* (2023.01); *G06N 5/04* (2013.01); *G06N 20/00* (2019.01); *G06T 7/0004* (2013.01); *G06T 7/62* (2017.01); *G06T 2207/20081* (2013.01); *G06T 2207/30108* (2013.01); *H10K 59/12* (2023.02)

(58) Field of Classification Search
None
See application file for complete search history.

(56) References Cited

U.S. PATENT DOCUMENTS 8,310,417 B2 * 11/2012 Choi .................... G09G 3/3233
345/80
9,989,818 B2 * 6/2018 Jeon .................. G02F 1/134336
(Continued)

FOREIGN PATENT DOCUMENTS

JP  2005290623 A  * 10/2005

OTHER PUBLICATIONS

LUT-based compensation model for OLED degradation. Antonio-Torres et al. (Year: 2004).*

(Continued)

*Primary Examiner* — Delomia L Gilliard
(74) *Attorney, Agent, or Firm* — CANTOR COLBURN LLP

(57) ABSTRACT

According to an embodiment of the disclosure, an aperture ratio measurement device includes an actual aperture ratio measurement unit which image some mother substrates selected from a plurality of mother substrates and calculate an aperture ratio actual measurement value of a pixel for the imaged some mother substrates, an estimation aperture ratio measurement unit which learn sensing data for each of the plurality of mother substrates and calculate an aperture ratio prediction value of a pixel for all or a group of the plurality of mother substrates, and an addition unit which calculate a final aperture ratio prediction value based on the aperture ratio actual measurement value and the aperture ratio prediction value.

20 Claims, 14 Drawing Sheets

(51) Int. Cl.
*G06N 5/04* (2023.01)
*G06N 20/00* (2019.01)
*G06T 7/00* (2017.01)
*G06T 7/62* (2017.01)
*H10K 59/12* (2023.01)

(56) References Cited

U.S. PATENT DOCUMENTS

| | | | | |
|---|---|---|---|---|
| 11,841,615 | B2* | 12/2023 | Zhang | G03F 7/16 |
| 2003/0030381 | A1* | 2/2003 | Yamazaki | H10K 59/131 |
| | | | | 315/169.3 |
| 2005/0219186 | A1* | 10/2005 | Kamada | G02F 1/134336 |
| | | | | 345/90 |
| 2008/0186422 | A1* | 8/2008 | Ishii | G02F 1/1368 |
| | | | | 349/110 |
| 2014/0033552 | A1* | 2/2014 | Hu | G01B 11/002 |
| | | | | 33/227 |
| 2016/0148851 | A1* | 5/2016 | Okamoto | H01L 21/32136 |
| | | | | 438/9 |
| 2016/0372528 | A1* | 12/2016 | Kamura | H10K 50/865 |
| 2018/0309061 | A1* | 10/2018 | Chun | G06T 7/0004 |
| 2019/0163006 | A1* | 5/2019 | Lu | G02F 1/134336 |
| 2019/0172850 | A1* | 6/2019 | Wang | H01L 27/1259 |
| 2020/0056301 | A1* | 2/2020 | Mitsuya | H01L 21/76879 |
| 2020/0098089 | A1* | 3/2020 | Park | G09G 3/20 |
| 2020/0342820 | A1* | 10/2020 | Yoshida | G09G 3/3655 |
| 2021/0390683 | A1* | 12/2021 | Park | G06N 3/08 |

OTHER PUBLICATIONS

Reducing Image Sticking in AMOLED Displays with time-ratio gray scale by analog calibration. Shin et al. (Year: 2009).*
LightGBM: A Highly Efficient Gradient Boosting Decision Tree. Ke et al. (Year: 2017).*
Antonio-Torees, et al., "LUT-based Compensation Model for OLED Degradation", May 2005, pp. 435-441, vol. 13, No. 5, Journal of the Society for Information Display.
Shin et al., "Reducing Image Sticking in AMOLED Displays with Time-ratio Gray Scale by Analog Calibration", Sep. 2009, pp. 705-713, vol. 17, No. 9, Journal of the Society for Information Display.
Ke et al., "LightGBM: A Highly Efficient Gradient Boosting Decision Tree", Dec. 2017, pp. 1-9, 31st Conference on Neural Information Processing Systems (NIPS 2017), Long Beach, CA, USA.

* cited by examiner

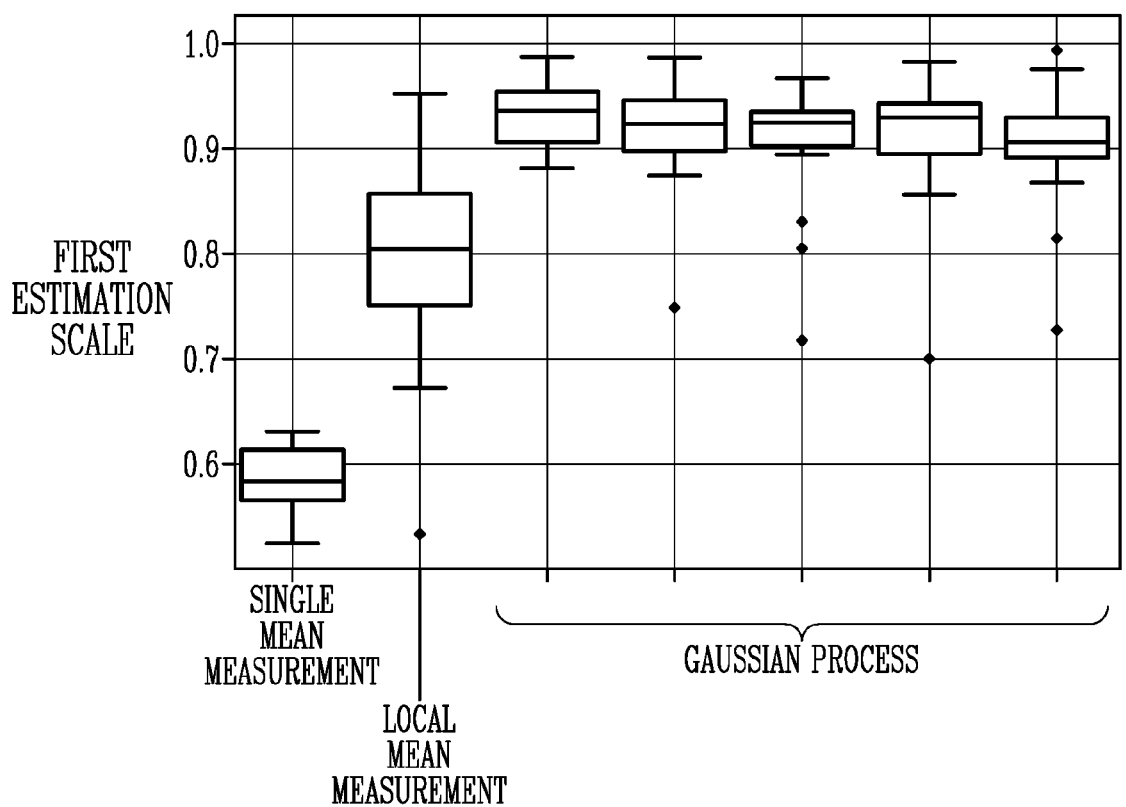

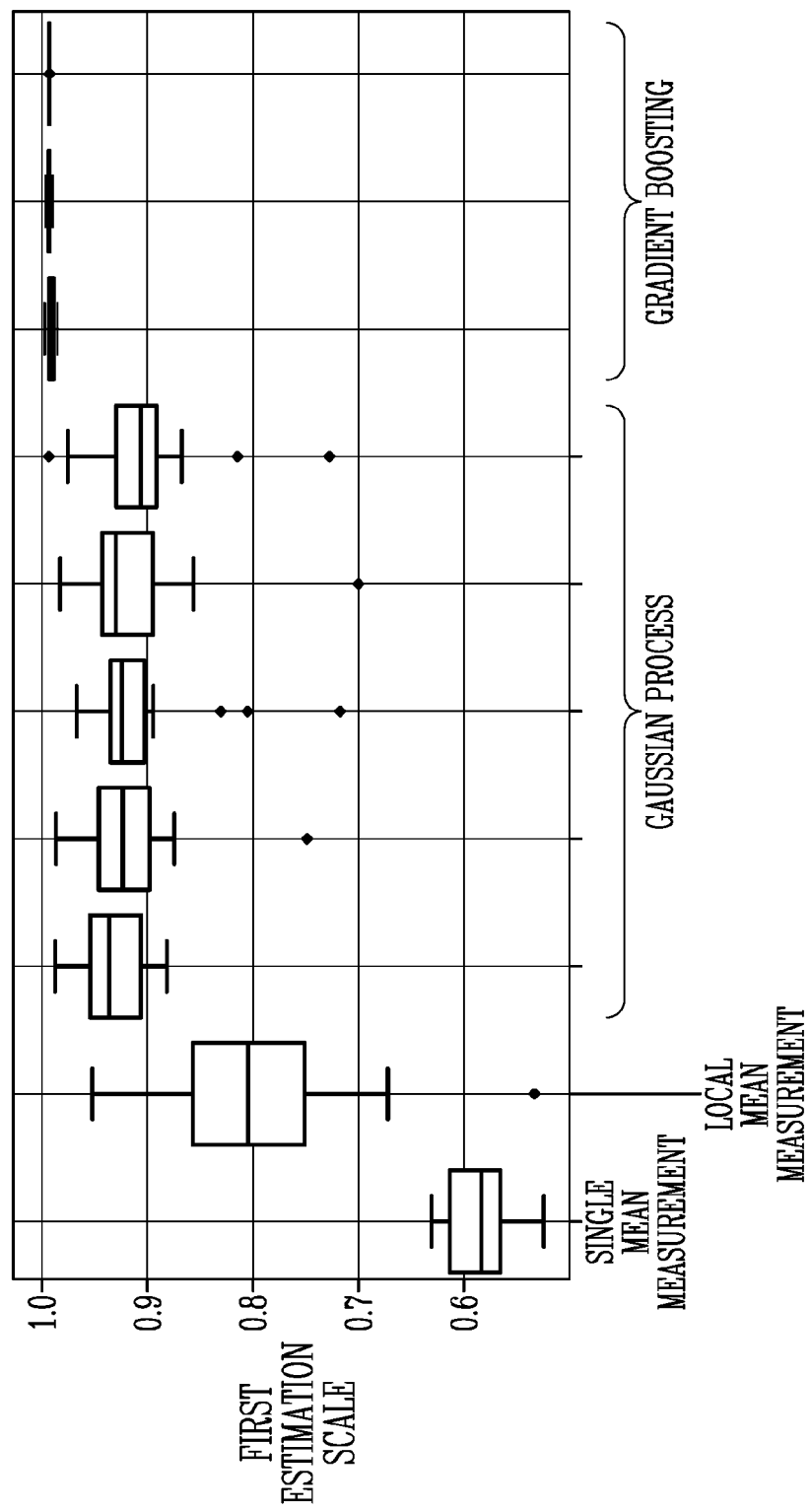

APERTURE RATIO MEASUREMENT DEVICE AND DETERIORATION COMPENSATION SYSTEM OF DISPLAY DEVICE INCLUDING THE SAME

This application claims priority from and the benefit of Korean Patent Application No. 10-2020-0070440, filed on Jun. 10, 2020, which is hereby incorporated by reference for all purposes as if fully set forth herein.

BACKGROUND

Field

Exemplary embodiments and implementations of the inventive concepts relate generally to an aperture ratio measurement device and a deterioration compensation system of a display device including the same.

Discussion of the Background

A display device includes pixels. Each of the pixels charges a data signal to a storage capacitor and emits light at a luminance corresponding to the charged data signal using a light emitting element.

The light emitting element may be set as a self-emitting element that generates light of a predetermined luminance in correspondence with a current (or voltage) supplied to the light emitting element. When the light emitting element is a self-emitting element, a luminance may decrease due to deterioration of a material itself.

In particular, as the light emitting elements included in each of the pixels are unevenly deteriorated, a luminance variation and an afterimage may occur between the pixels. Therefore, compensation of image data may be required to improve display quality of the display device.

The above information disclosed in this Background section is only for understanding of the background of the inventive concepts, and, therefore, it may contain information that does not constitute prior art.

SUMMARY

An object described in the disclosure is to provide an aperture ratio measurement device capable of predicting an aperture ratio with respect to all or a group of mother substrates at a reduced cost and time compared to an actual measuring method.

Another object described in the disclosure is to provide a deterioration compensation system of a display device, which compensates for image data by reflecting an aperture ratio deviation.

Additional features of the inventive concepts will be set forth in the description which follows, and in part will be apparent from the description, or may be learned by practice of the inventive concepts.

An aperture ratio measurement device addressing the object includes an actual aperture ratio measurement unit which images some mother substrates selected from a plurality of mother substrates and calculates an aperture ratio actual measurement value of a pixel for the imaged some mother substrates, an estimation aperture ratio measurement unit which learns sensing data for each of the plurality of mother substrates and calculates an aperture ratio prediction value of a pixel for all or a group of the plurality of mother substrates, and an addition unit which calculates a final aperture ratio prediction value based on the aperture ratio actual measurement value and the aperture ratio prediction value.

The sensing data may include at least one of a process speed, a process temperature, a photoresist thickness, a photoresist temperature, and an exposure amount of a substrate manufacturing device manufacturing the plurality of mother substrates.

An aperture ratio of the pixel may be a ratio of an area of an emission area of the pixel to a total area of the pixel.

The aperture ratio of the pixel may be calculated based on a shortest distance between two opposing sides when the emission area has a quadrangle shape.

The estimation aperture ratio measurement unit may calculate the aperture ratio prediction value using a plurality of machine learning models.

The plurality of machine learning models may include extreme gradient boost (XG boost), categorical boosting (Cat boost), and light gradient boost machine (light GBM).

The addition unit may give a weight to each aperture ratio prediction value calculated by the plurality of machine learning models, using an ensemble machine learning model, and add each aperture ratio prediction value.

The ensemble machine learning model may include a reliability statistic value calculation unit that calculates a reliability statistic value based on the aperture ratio actual measurement value, a weight history management unit that stores an average weight gives to each of the machine learning models, and a re-learning history management unit that stores the number of re-learning of each of the machine learning models.

The reliability statistic calculation unit may give a higher reliability statistic value to a machine learning model having a smaller difference between the aperture ratio actual measurement value and the aperture ratio prediction value.

The reliability statistic value calculation unit may give a higher reliability statistic value to the machine learning model having a longer learning period when learning periods of the plurality of machine learning models (ML1 to MLn) are different from each other.

The ensemble machine learning model may include a weight determination unit which determines a weight of each of the machine learning models based on the reliability statistic value, the average weight, and the number of re-learning, and a re-learning discrimination unit which discriminates whether to re-learn each of the machine learning models based on the reliability statistic value, the average weight, and the number of re-learning.

The weight determination unit may give a higher weight to a machine learning model having the greater reliability statistic value, the greater average weight, and the less number of re-learning.

The re-learning discrimination unit may give a less re-learning opportunity to the machine learning model having the greater reliability statistic value, the greater average weight, and the less number of re-learning.

The aperture ratio measurement device may further include an outlier detection unit which detects an outlier that is a value exceeding a preset range among the final aperture ratio prediction values.

The outlier detection unit may use a machine learning model of any one of stacked auto encoder, sparse auto encoder, and denoising auto encoder.

A deterioration compensation system of a display device configured to address the object includes a substrate manufacturing device which manufactures mother substrates including a plurality of display panels, an aperture ratio measurement device which calculates a final aperture ratio prediction value of a pixel included in the mother substrates, and a manufacturing device of the display device, which inputs the final aperture ratio prediction value to each of the display panels.

The aperture ratio measurement device includes an actual aperture ratio measurement unit which images some mother substrates selected from the mother substrates and calculates an aperture ratio actual measurement value of a pixel for the imaged some mother substrates, an estimation aperture ratio measurement unit which learns sensing data for each of the mother substrates and calculates the aperture ratio prediction value of a pixel for all or a group of the mother substrates, and an addition unit which calculates the final aperture ratio prediction value based on the aperture ratio actual measurement value and the aperture ratio prediction value.

The sensing data may include at least one of a process speed, a process temperature, a photoresist thickness, a photoresist temperature, and an exposure amount of the substrate manufacturing device.

An aperture ratio of the pixel may be a ratio of an area of an emission area of the pixel to a total area of the pixel.

The estimation aperture ratio measurement unit may calculate the aperture ratio prediction value using a plurality of machine learning models.

The addition unit may give a weight to each aperture ratio prediction value calculated by the plurality of machine learning models, using an ensemble machine learning model, and add each aperture ratio prediction value.

The aperture ratio measurement device according to embodiments of the disclosure may predict the aperture ratio at reduced cost and time compared to a method of actually measuring the aperture ratio for all or a group of mother substrates by predicting the aperture ratio of a pixel through machine learning.

In addition, the deterioration compensation system of the display device according to embodiments of the disclosure may compensate for image data by reflecting an aperture ratio deviation However, an effect of the disclosure is not limited to the above-described effect, and may be variously expanded without departing from the spirit and scope of the disclosure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 8A and 8B are diagrams illustrating an estimation scale of embodiments of calculating the aperture ratio prediction value;

FIGS. 11A and 11B are diagrams illustrating an effect of a gradient boosting model (gradient boosting machine).

DETAILED DESCRIPTION OF THE EMBODIMENT

Figure 1:
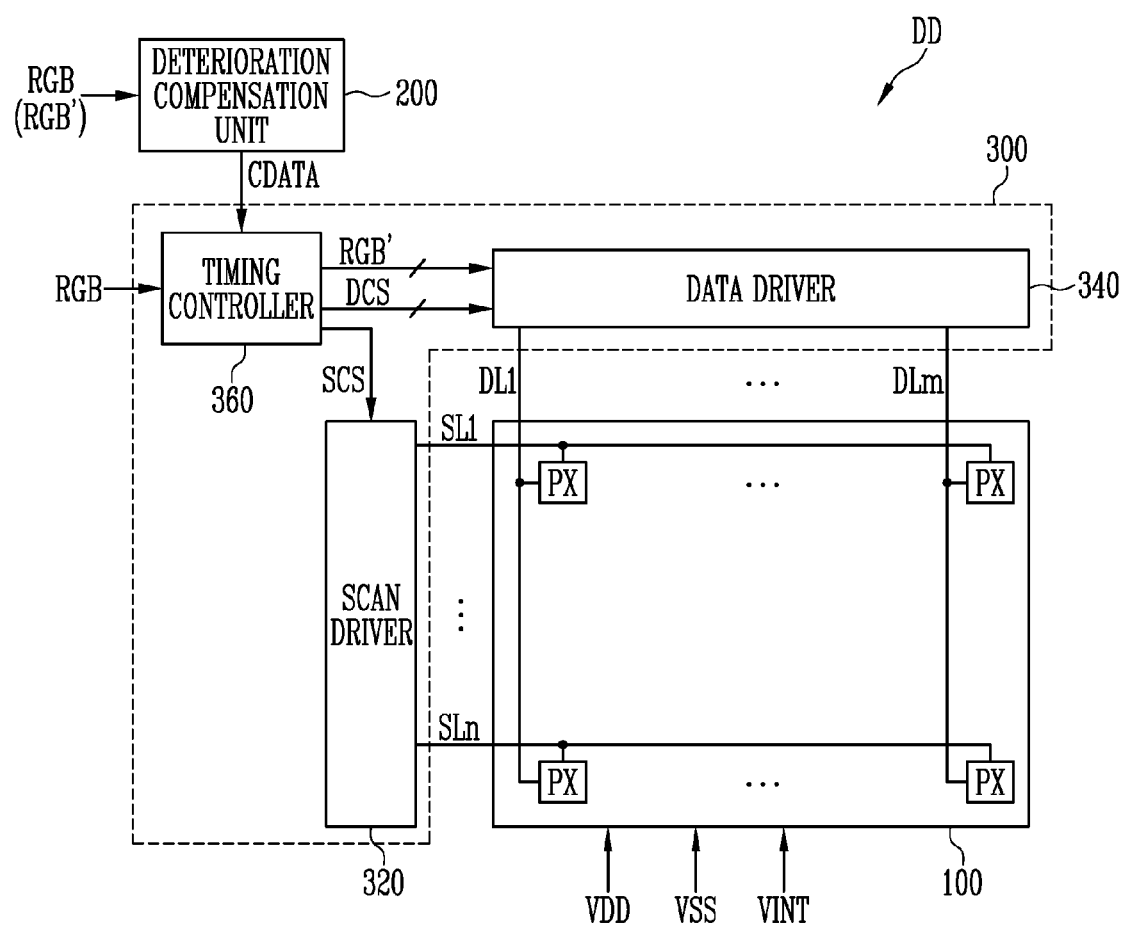
FIG. 1 is a block diagram illustrating a display device according to embodiments of the disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A degree of deterioration of a light emitting element in a display device may be affected by an aperture ratio of a pixel. For example, when a plurality of pixels are required to emit light with the same luminance, pixels having a relatively small aperture ratio have a higher current density than pixels having a relatively large aperture ratio, and thus a lifespan (that is, a lifespan of a light emitting element) may decrease.

Therefore, when image data is compensated, more precise compensation may be possible in a case where an aperture ratio deviation of the pixel is reflected. However, in general, the aperture ratio of the pixel is measured by imaging an image of a mother substrate with a magnifier, which requires a lot of cost and time.

Figure 2:
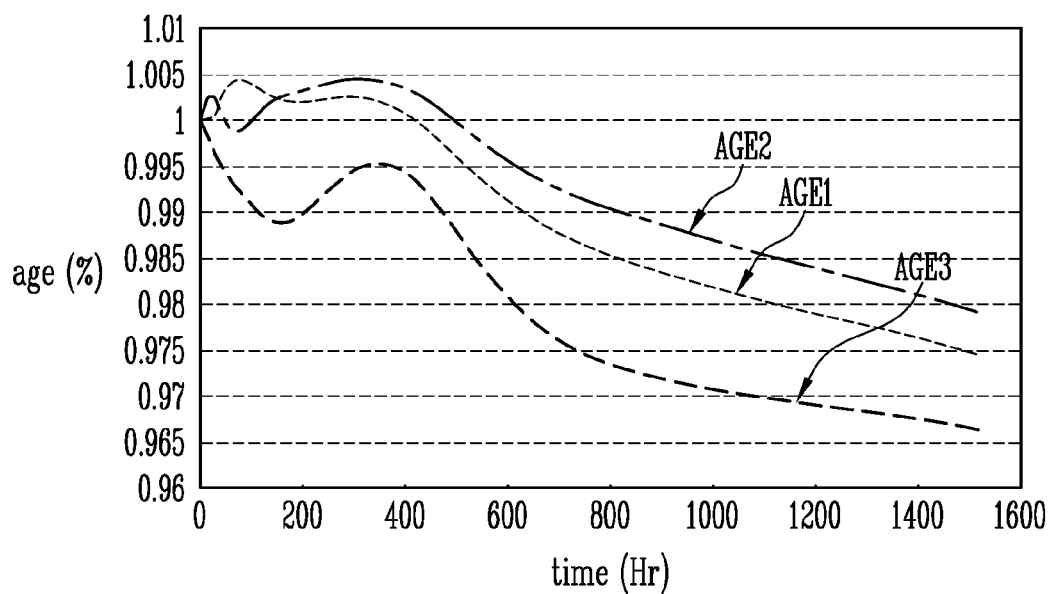
FIG. 2 is a graph schematically illustrating an example of a lifespan distribution of a pixel due to an aperture ratio difference of the pixel.

FIG. 1 is a block diagram illustrating a display device according to embodiments of the disclosure, and FIG. 2 is a graph schematically illustrating an example of a lifespan distribution of a pixel due to an aperture ratio difference of the pixel.

Referring to FIGS. 1 and 2, the display device DD may include a display panel 100, a deterioration compensation unit 200, and a panel driver 300.

The display panel 100 may include a plurality of pixels PX and display an image. The pixels PX may be positioned in an area partitioned by scan lines SL1 to SLn and data lines DL1 to DLm. In an embodiment, each of the pixels PX may include a plurality of sub pixels. Each of the sub pixels may emit color light of one of red, green, and blue. However, this is an example, and each of the sub pixels may emit color light of cyan, magenta, yellow, white, or the like.

The deterioration compensation unit 200 may output deterioration compensation data CDATA using a stress compensation weight generated by accumulating image data and a compensation factor generated based on an aperture ratio of a pixel.

In an embodiment, the deterioration compensation unit 200 may accumulate the image data and generate the stress compensation weight using a stress value calculated from the accumulated image data RGB and/or RGB'. The stress value may include information of a light emission time, a grayscale, a luminance, a temperature, and the like of the pixels PX.

The stress value may be a value calculated by synthesizing the entire image data of the entire pixels PX, or may be generated in a unit of a pixel block including an individual pixel or grouped pixels. That is, the stress value may be equally applied to an entire set of pixels, or may be independently calculated for each individual pixel or grouped pixel.

In an embodiment, the deterioration compensation unit 200 may include a compensation factor determination unit that determines a compensation factor based on a distance between adjacent sub pixels, and a data compensation unit that generates the deterioration compensation data CDATA to compensate for the image data RGB and/or RGB' by applying the compensation factor to the stress compensation weight. That is, the deterioration compensation data CDATA may include the compensation factor (that is, an aperture ratio compensation factor) that compensates for the stress compensation weight and the aperture ratio difference.

In an embodiment, the deterioration compensation unit 200 may be implemented as a separate application processor (AP). In another embodiment, at least some or the entire configuration of the deterioration compensation unit 200 may be included in a timing controller 360. In further another embodiment, the deterioration compensation unit 200 may be included in an IC including a data driver 340.

In an embodiment, the panel driver 300 may include a scan driver 320, the data driver 340, and the timing controller 360.

The scan driver 320 may provide a scan signal to the pixels PX of the display panel 100 through the scan lines SL1 to SLn. The scan driver 320 may provide the scan signal to the display panel 100 based on a scan control signal SCS received from the timing controller 360.

The data driver 340 may provide a data signal to the pixels PX to which the deterioration compensation data CDATA is applied through the data lines DL1 to DLm. The data driver 340 may provide a data signal (data voltage) to the display panel 100 based on a data driving control signal DCS received from the timing controller 360. In an embodiment, the data driver 340 may convert the image data RGB' to which the deterioration compensation data CDATA is applied to the data signal (data voltage) of an analog format.

In an embodiment, the data driver 340 may output a magnitude of the data voltage corresponding to the image data RGB' generated based on the deterioration compensation data CDATA, according to the aperture ratio. For example, when the aperture ratio is greater than a preset reference aperture ratio, a magnitude of an absolute value of the compensated data voltage may be greater than a magnitude of an absolute value of the data voltage before compensation in which the aperture ratio is not reflected. When the aperture ratio is less than the preset reference aperture ratio, the magnitude of the absolute value of the compensated data voltage may be less than the magnitude of the absolute value of the data voltage before compensation in which the aperture ratio is not reflected.

The timing controller 360 may receive the image data RGB from an external graphic source or the like, and control driving of the scan driver 320 and the data driver 340. The timing controller 360 may generate the scan control signal SCS and the data driving control signal DCS. In an embodiment, the timing controller 360 may generate the compensation image data RGB' by applying the deterioration compensation data CDATA to the image data RGB. The compensation image data RGB' may be provided to the data driver 340.

In an embodiment, the panel driver 300 may further include a power supply that generates a first power voltage VDD, a second power voltage VSS, and an initialization power voltage VINT to drive the display panel 100.

FIG. 2 illustrates a distribution of a lifespan curve of the pixel PX (or the display panel 100) according to the aperture ratio of the pixel PX. An organic light emitting element included in the pixel has a characteristic in which a luminance decreases over time due to deterioration of a material itself. Therefore, as illustrated in FIG. 2, the luminance of the pixel PX and/or the display panel decreases over time, and thus a lifespan decreases.

For example, an aperture ratio difference may occur for each display panel 100 or for each pixel PX due to a formation process distribution of the pixel PX. Here, the aperture ratio of one pixel PX may be a ratio of the area of an emission area of the one pixel PX to the total area of the one pixel defined by the pixel definition film. The emission area may correspond to the area of a surface of a first electrode exposed by the pixel definition film.

The aperture ratio of the pixel PX affects an electron-hole recombination amount in an emission layer inside the light emitting element and a current density flowing to the light emitting element. For example, the current density may decrease according to an increase of the aperture ratio of the pixel PX, and a lifespan reduction speed over time of the pixel may decrease due to the decrease of the current density.

The lifespan curve according to the reference aperture ratio (indicated by AGE1) may be illustrated as in FIG. 2. The reference aperture ratio may be a value set during a display panel setup process. When the aperture ratio (or the aperture ratio of the display panel 100) of the pixel PX is greater than the reference aperture ratio due to the process distribution, because the cross-sectional area of an organic light emitting diode increases and thus the current density decreases, the lifespan reduction speed may be decreased (that is, indicated by AGE2). That is, a slope of the lifespan curve becomes gentle. In addition, when the aperture ratio of the pixel PX (or the aperture ratio of the display panel 100) is less than the reference aperture ratio due to the process distribution, the lifespan reduction speed may be increased (that is, indicated by AGE3). That is, the slope of the lifespan curve may be steep.

As such, a large deviation may occur in the lifespan curve over time according to the aperture ratio of the pixel PX. The display device DD according to embodiments of the disclosure may further apply a compensation factor reflecting the aperture ratio deviation to the deterioration compensation data CDATA by the deterioration compensation unit 200. Therefore, a lifespan curve deviation between the pixels PX or the display panels 100 due to the aperture ratio deviation may be improved, and the lifespan curves may be corrected to correspond to a target lifespan curve. Therefore, application of an afterimage compensation (deterioration compensation) algorithm based on a luminance decrease may become easy.

Figure 3:
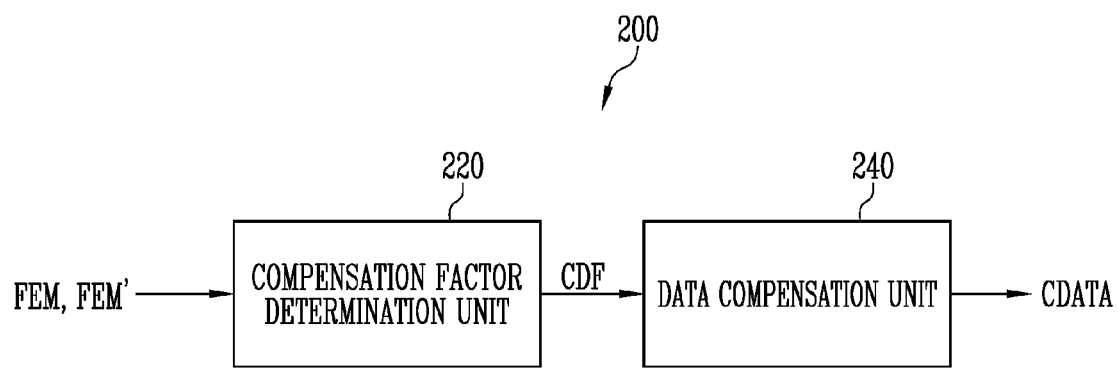
FIG. 3 is a block diagram illustrating a deterioration compensation unit according to embodiments of the disclosure.

FIG. 3 is a block diagram illustrating the deterioration compensation unit according to embodiments of the disclosure.

Referring to FIG. 3, the deterioration compensation unit 200 may include a compensation factor determination unit 220 and a data compensation unit 240.

The compensation factor determination unit 220 may determine a compensation factor CDF based on a final aperture ratio prediction value FEM or FEM' (refer to FIG. 4) of the pixels PX. The compensation factor CDF may be an aperture ratio compensation factor CDF. That is, the aperture ratio compensation factor CDF may be a compensation value to improve the distribution of the lifespan curve of FIG. 2.

The data compensation unit 240 may generate the deterioration compensation data CDATA to compensate the image data RGB and/or RGB' by applying the aperture ratio compensation factor CDF to the stress compensation weight. The stress compensation weight may be calculated according to the stress value extracted from the accumulated image data. The stress value may include accumulation luminance, accumulation light emission time, temperature information, and the like.

As described above, the deterioration compensation unit 200 according to embodiments of the disclosure may reflect the aperture ratio compensation factor CDF that compensates for the aperture ratio deviation in the deterioration compensation data CDATA, and thus the lifespan curves of the display panel or the pixel according to the aperture ratio deviation may be shifted toward the target lifespan curve. Therefore, the distribution of the lifespan curves may be uniformly improved.

According to an embodiment of the disclosure, the final aperture ratio prediction value FEM or FEM' (refer to FIG. 4) of the pixels PX may receive from an aperture ratio measurement device, which will be described later. Hereinafter, the aperture ratio measurement device will be described in detail with reference to FIGS. 4 to 10.

Figure 4:
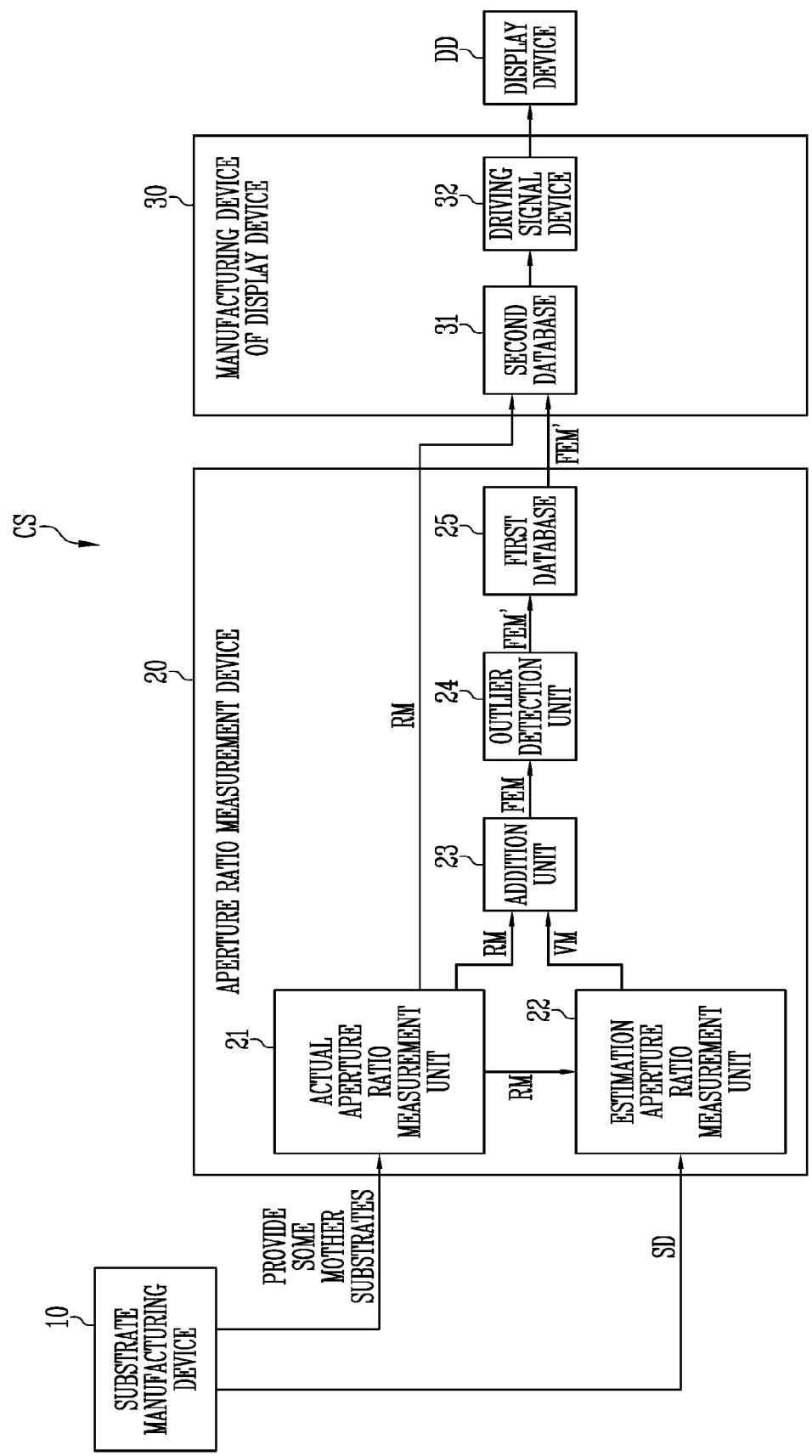
FIG. 4 is a block diagram illustrating a deterioration compensation system of the display device.
Figure 5:
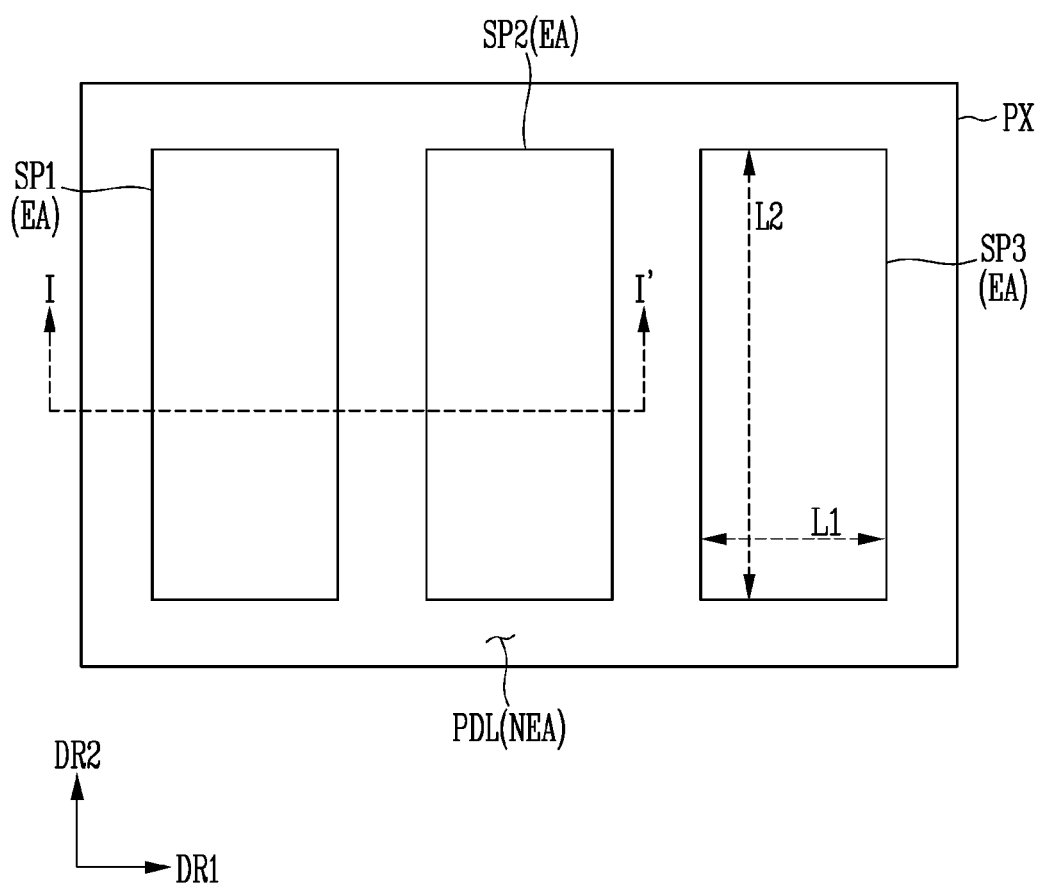
FIG. 5 is an enlarged view of the pixel of FIG. 1 to describe an aperture ratio actual measurement method.
Figure 6:
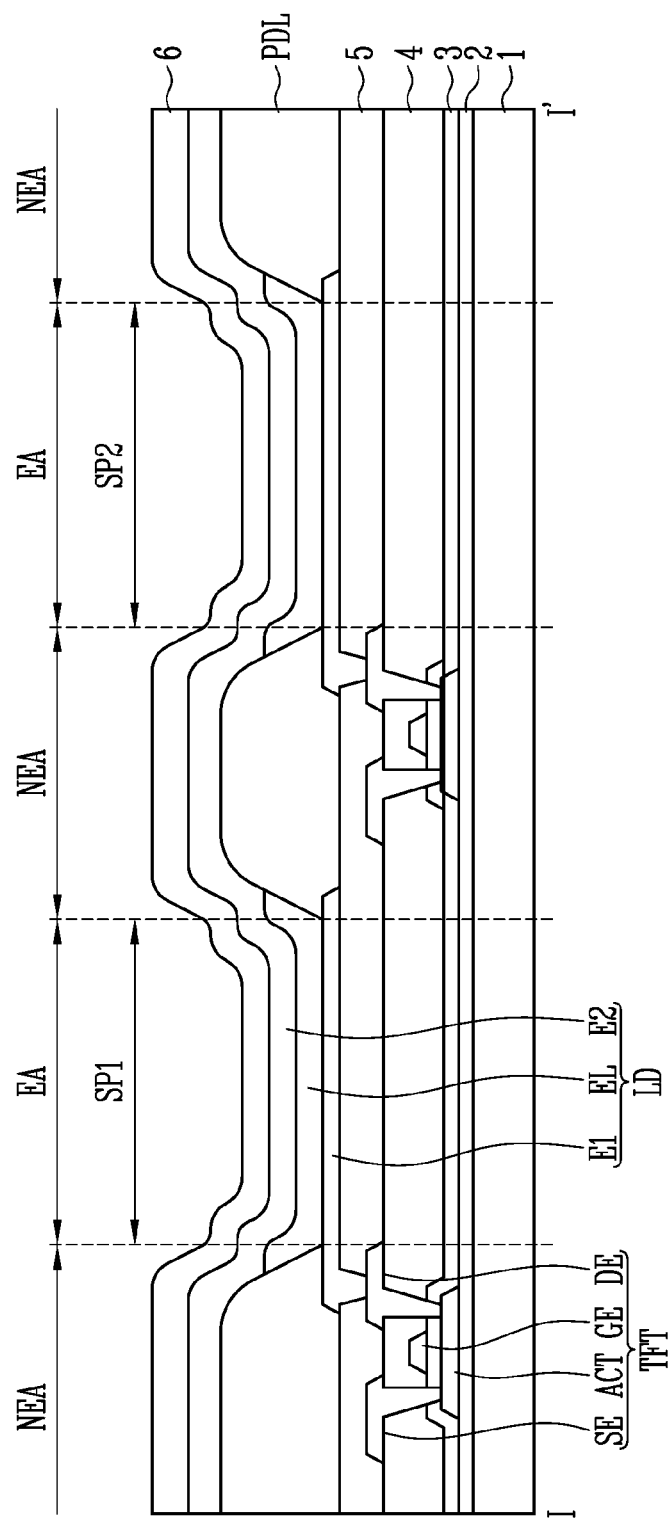
FIG. 6 is a cross-sectional view taken along a line I-I' of FIG. 5.
Figure 7A:
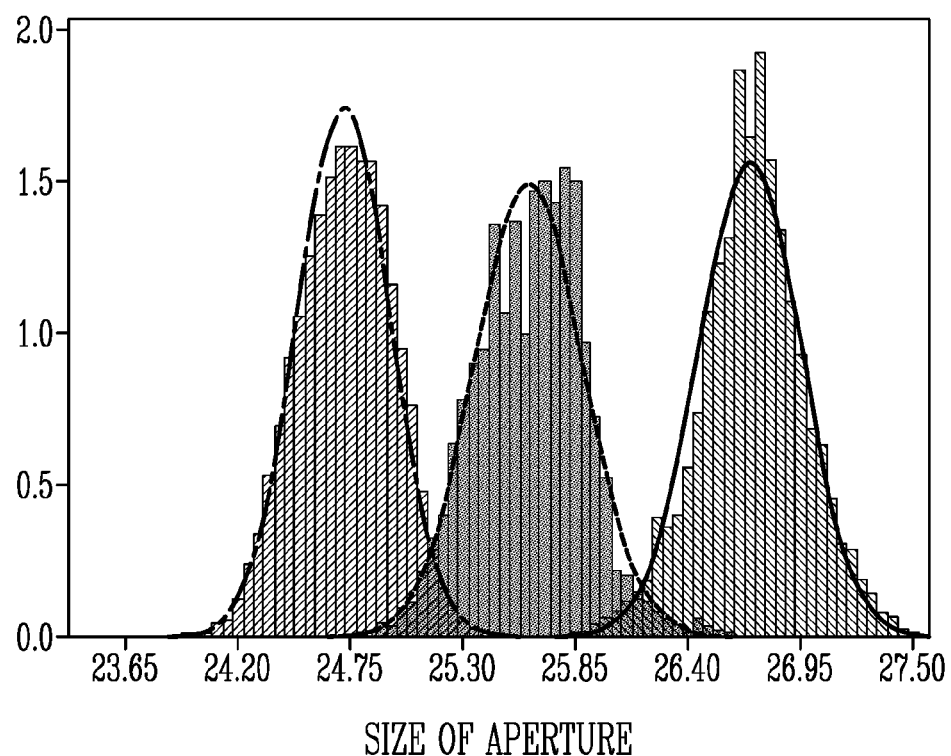
FIGS. 7A to 7C are diagrams illustrating various embodiments of calculating an aperture ratio prediction value.
Figure 7B:
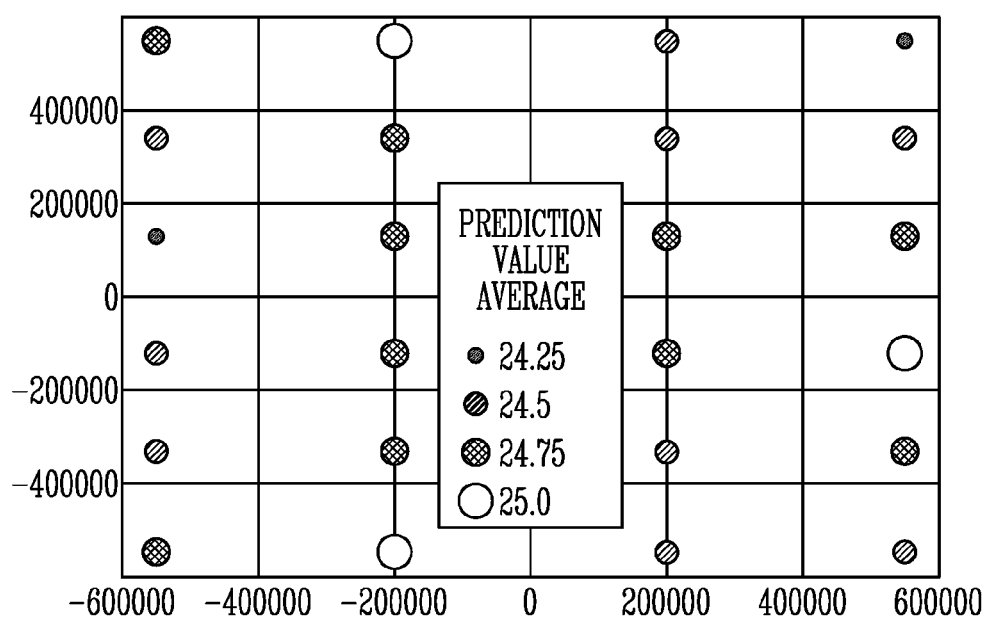
Figure 7C:
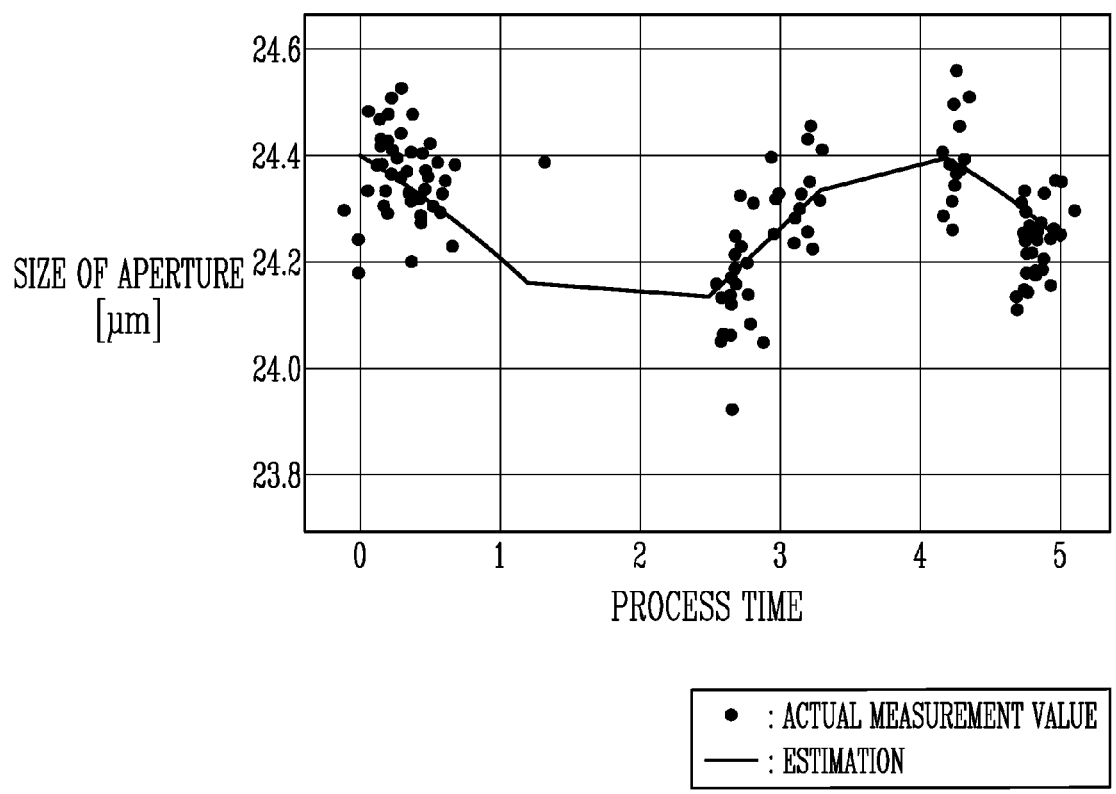
Figure 8B:
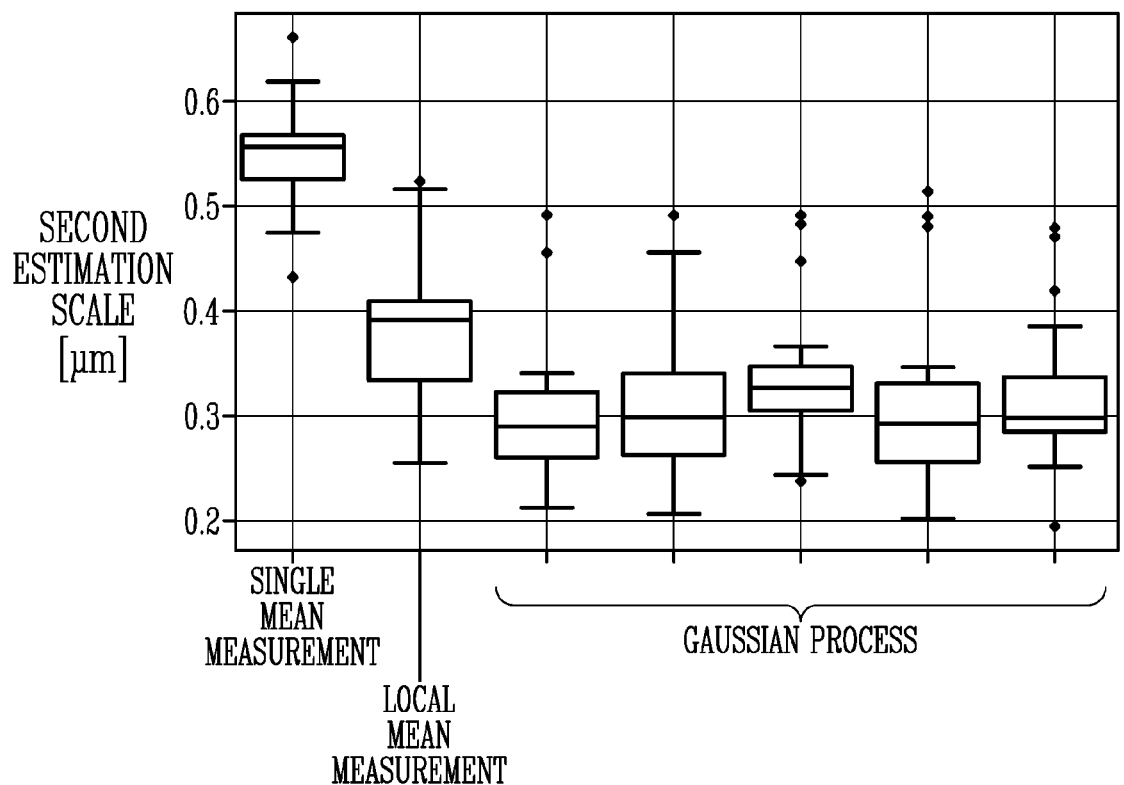
Figure 9:
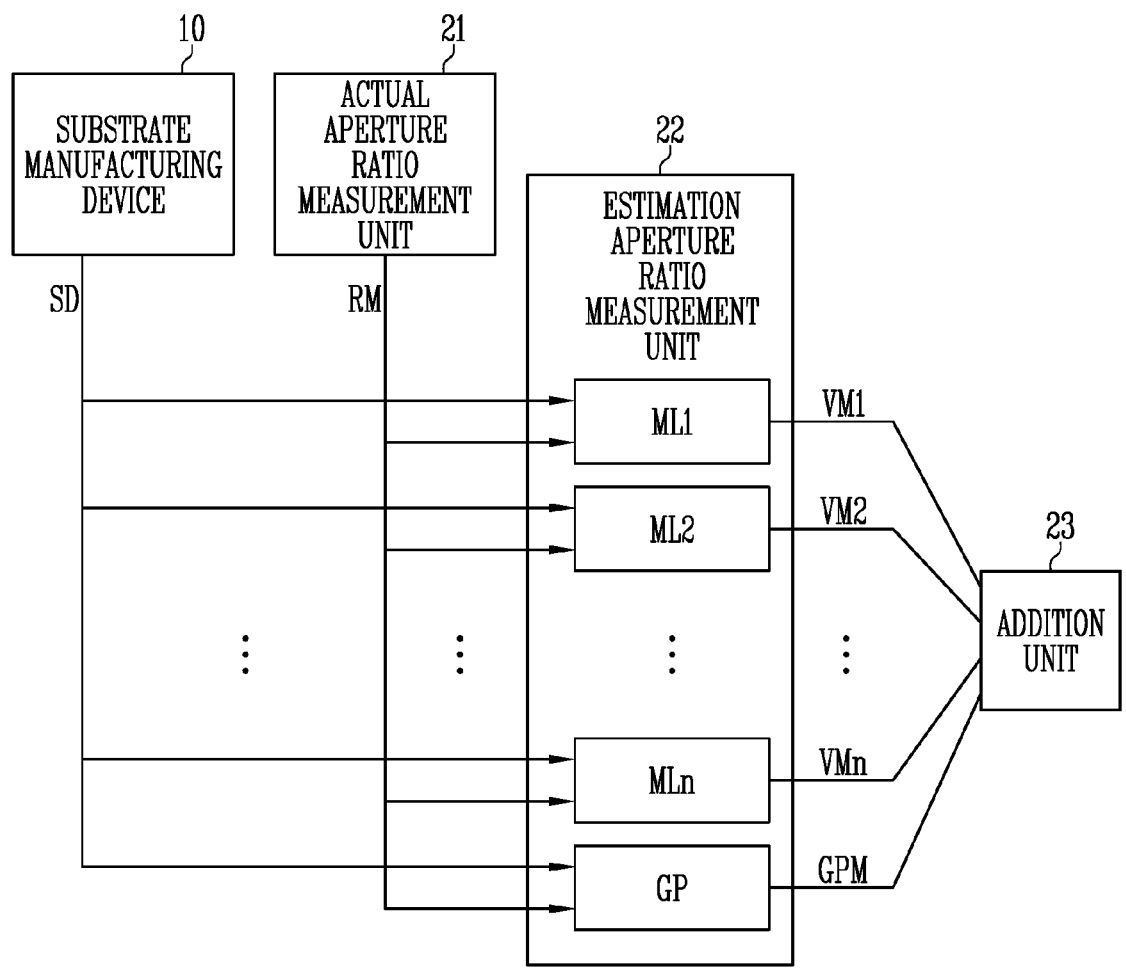
FIG. 9 is a block diagram illustrating an estimation aperture ratio measurement unit.
Figure 10:
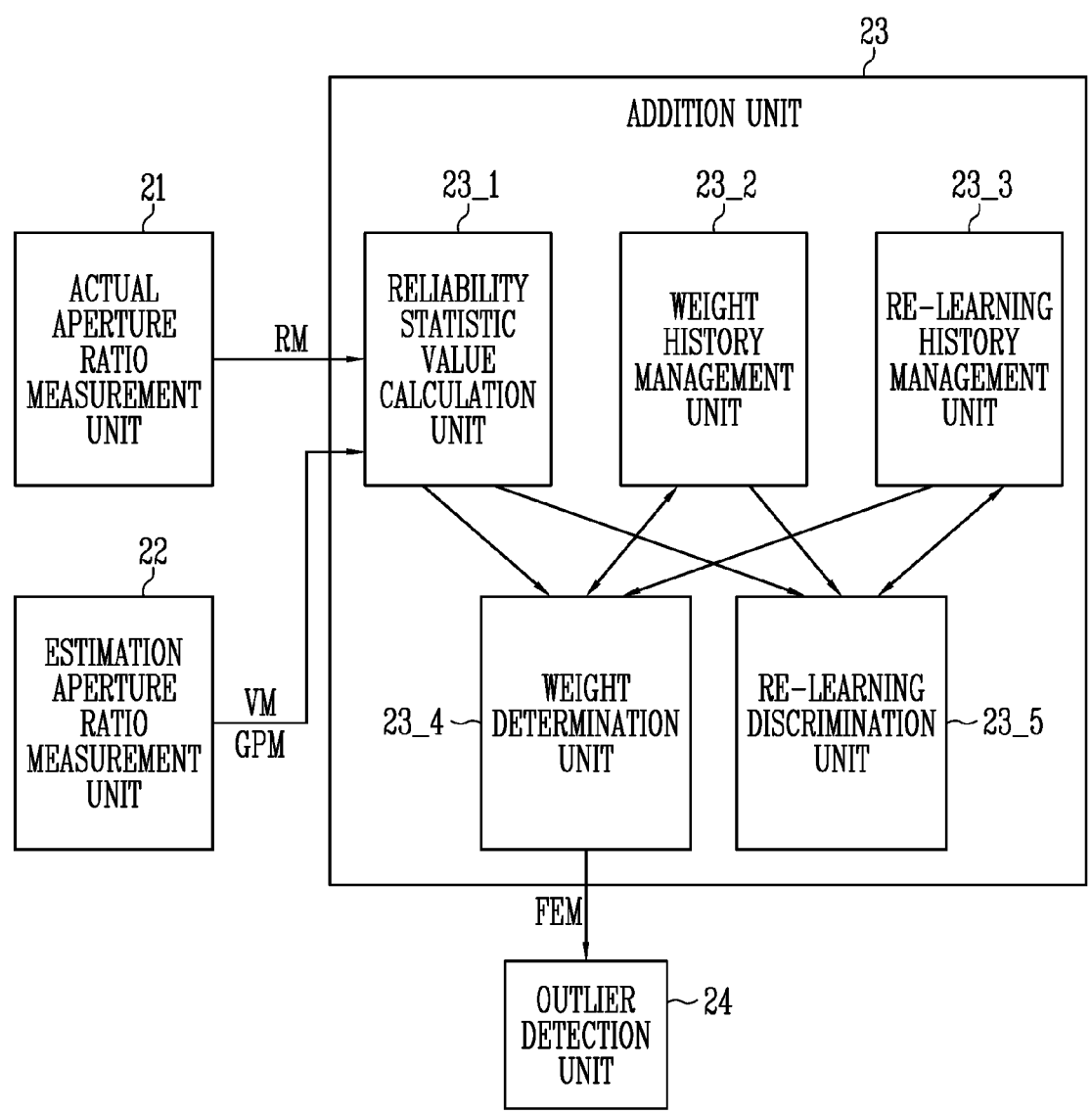
FIG. 10 is a block diagram illustrating an addition unit.

FIG. 4 is a block diagram illustrating a deterioration compensation system of the display device. FIG. 5 is an enlarged view of the pixel of FIG. 1 to describe the aperture ratio actual measurement method. FIG. 6 is a cross-sectional view taken along a line I-I' of FIG. 5. FIGS. 7A to 7C are diagrams illustrating various embodiments of calculating an aperture ratio prediction value. FIGS. 8A and 8B are diagrams illustrating an estimation scale of embodiments of calculating the aperture ratio prediction value. FIG. 9 is a block diagram illustrating an estimation aperture ratio measurement unit. FIG. 10 is a block diagram illustrating an addition unit.

Referring to FIGS. 1 and 4, a display device deterioration compensation system CS may include a substrate manufacturing device 10 that produces mother substrates including a plurality of display panels 100, an aperture ratio measurement device 20 that calculates the final aperture ratio prediction value of the pixel PX included in the mother substrate, and a manufacturing device 30 of the display device, which inputs the final aperture ratio prediction value FEM or FEM' (refer to FIG. 4) to each of the display panels 100. The mother substrate may be defined as a substrate including a plurality of display panels 100.

According to an embodiment of the disclosure, the substrate manufacturing device 10 may be a device that performs a photo process configured to form a halftone pixel definition film on the mother substrate.

The substrate manufacturing device 10 may perform a process diagnosis. The process diagnosis refers to a series of technologies or processes that increase production reliability by detecting a sudden defect of the substrate manufacturing device 10 in advance through various external sensors or measurement devices. When a sensor attached to the substrate manufacturing device 10 diagnoses an abnormality or normality (fault detection and classification (FDC)), a system adjusting a process or a device setting may correct an abnormality state in response thereto. Therefore, productivity of the substrate manufacturing device 10 may be improved.

For example, the substrate manufacturing device 10 may include an optical sensor and a temperature sensor configured to diagnose whether the photo process is properly performed. The various sensors may sense information on a process speed of each unit included in the substrate manufacturing device 10, a process temperature in the substrate manufacturing device 10, a thickness of a photoresist applied on a substrate for the photo process, a temperature and an exposure amount of the photoresist, and the like.

The substrate manufacturing device 10 may generate sensing data including at least one of the process speed, the process temperature, the thickness of the photoresist, the temperature of the photoresist, and the exposure amount of the substrate manufacturing device 10, and provide the sensing data to the aperture ratio measurement device 20.

The aperture ratio measurement device 20 may include an actual aperture ratio measurement unit 21 that images a quantity of mother substrates selected from the plurality of mother substrates and calculates an aperture ratio measurement value of the pixels for the imaged mother substrates, an estimation aperture ratio measurement unit 22 that calculates the aperture ratio prediction value of the pixel for all or a group of the plurality of mother substrates by learning the sensing data for each of the plurality of mother substrates, and an addition unit 23 that calculates the final aperture ratio prediction value based on the aperture ratio actual measurement value and the aperture ratio prediction value.

The actual aperture ratio measurement unit 21 may image at least some of the plurality of mother substrates manufactured by the substrate manufacturing device 10, with an imaging device such as a camera, and measure an aperture ratio actual value of the pixels PX included in the mother substrates. Hereinafter, a method of measuring the aperture ratio of the pixel PX will be described with reference to FIGS. 1, 5, and 6. FIG. 6 is illustrated under an assumption that the light emitting element is an organic light emitting diode (OLED), but the disclosure is not limited thereto.

The display panel 100 may include the plurality of pixels PX. In an embodiment, the pixel PX may include first to third sub pixels SP1, SP2, and SP3. The pixel PX may be disposed in a stripe structure in which each of the first to third sub pixels SP1, SP2, and SP3 is disposed along a first direction DR1. However, this is an example, and a structure of the pixel PX may be variously formed. For example, the pixel PX may be disposed in a pentile structure.

Each of the first to third sub pixels SP1, SP2, and SP3 may emit one of red, green, and blue light. Here, the first to third sub pixels SP1, SP2, and SP3 may be divided into an emission area EA and a peripheral area NEA.

Meanwhile, the display panel 100 may include a substrate 1, a circuit element layer including at least one transistor TFT configured to drive the pixel PX, and a display element layer.

The substrate 1 may be a rigid substrate or a flexible substrate. The rigid substrate may include a glass substrate, a quartz substrate, a glass ceramic substrate, and a crystalline glass substrate. The flexible substrate may include a film substrate and a plastic substrate including a polymer organic material.

A buffer layer 2 may be disposed on the substrate 1. The buffer layer 2 may prevent diffusion of an impurity into the transistor TFT. The buffer layer 2 may be provided as a single layer, but may also be provided as multiple layers of at least two or more layers.

The circuit element layer including the transistor TFT and a plurality of conductive lines may be disposed on the buffer layer 2.

In an embodiment, an active pattern ACT may be disposed on the buffer layer 2. The active pattern ACT may be formed of a semiconductor material. For example, the active pattern ACT may include polysilicon, amorphous silicon, oxide semiconductor, and the like.

A gate insulating layer 3 may be disposed on the buffer layer 2 provided with the active pattern ACT. The gate insulating layer 3 may be an inorganic insulating film including an inorganic material.

A gate electrode GE may be disposed on the gate insulating layer 3, and a first insulating layer 4 may be disposed on the gate insulating layer 3 provided with the gate electrode GE. A source electrode SE and a drain electrode DE may be disposed on the first insulating layer 4. The source electrode SE and the drain electrode DE may pass through the gate insulating layer 3 and the first insulating layer 4 and may be connected to the active pattern ACT.

A second insulating layer 5 may be disposed on the first insulating layer 4 on which the source electrode SE and the drain electrode DE are disposed. The second insulating layer 5 may be a planarization layer.

A display element layer LD may include a first electrode E1, an emission layer EL, and a second electrode E2.

The first electrode E1 configuring the display element layer LD may be disposed on the second insulating layer 5. In an embodiment, the first electrode E1 may be provided as an anode of the display element layer LD. The first electrode E1 may pass through the second insulating layer 5 and may be connected to the drain electrode DE of the transistor TFT. The first electrode E1 may be patterned for each of the sub pixels SP1, SP2, and SP3. The first electrode E1 may be disposed on a portion of the emission area EA and the peripheral area NEA on the second insulating layer 5.

The first electrode E1 may be formed using a metal, an alloy, a metal nitride, a conductive metal oxide, a transparent conductive material, and the like. These may be used alone or in combination with each other.

The pixel definition film PDL may be disposed in the peripheral area NEA on the second insulating layer 5 and may expose a portion of the first electrode E1. The pixel definition film PDL may be formed of an organic material or an inorganic material. That is, the emission area EA of each of the pixels PX may be defined by the pixel definition film PDL.

The emission layer EL may be disposed on the first electrode E1 exposed by the pixel definition film PDL. The emission layer EL may be disposed to extend along a sidewall of the pixel definition film PDL. In an embodiment, the emission layer EL may be formed using at least one of organic light emitting materials capable of emitting different color lights (that is, red light, green light, blue light, and the like) according to the pixels.

The second electrode E2 may be commonly disposed on the pixel definition film PDL and the organic emission layer EL. In an embodiment, the second electrode E2 may be provided as a cathode of the display element layer LD. The second electrode E2 may be formed using a metal, an alloy, metal nitride, a conductive metal oxide, a transparent conductive material, and the like. These may be used alone or in combination with each other. Accordingly, the display element layer LD including the first electrode E1, the organic emission layer EL, and the second electrode E2 may be formed.

A thin film encapsulation layer 6 covering the second electrode E2 may be disposed on the second electrode E2. The thin film encapsulation layer 6 may include a plurality of insulating films covering the display element layer LD. For example, the thin film encapsulation layer 6 may have a structure in which an inorganic film and an organic film are alternately stacked. In addition, in some cases, the thin film encapsulation layer 6 may be an encapsulation substrate disposed on the display element layer LD and bonded to the substrate 1 through a sealant.

As described above, a portion in which the first electrode E1 is exposed by the pixel definition film PDL may be defined as the emission area EA, and an area in which the pixel definition film PDL is positioned may be defined as the peripheral area NEA. That is, the pixel definition film PDL may define a side portion of sub pixels adjacent to each other.

Referring to FIG. 5, the aperture ratio of the pixel PX may be defined as a ratio of the area of the emission area of the sub pixels SP1, SP2, and SP3 to the total area of the pixel. As illustrated in FIG. 5, the aperture ratio of the pixel PX may be a ratio of the total area of three rectangles indicated by the sub pixels SP1, SP2, and SP3 to the rectangle area indicated by the pixel PX.

According to an embodiment of the disclosure, the aperture ratio of the pixel PX may be calculated based on a length of at least one of the sub pixels SP1, SP2, and SP3 in a predetermined direction. Because, due to a process characteristic, the emission area EA of the sub pixels SP1, SP2, and SP3 are assumed to be enlarged or reduced in a substantially uniform ratio in up, down, left, and right directions, and thus lengths L1 and L2 of the emission area EA of at least one of the sub pixels SP1, SP2, and SP3 in a predetermined direction may be directly set as the aperture ratio actual measurement value.

For example, when the sub pixels SP1, SP2, and SP3 have a quadrangle shape, the aperture ratio of each of the sub pixels SP1, SP2, and SP3 may be calculated by measuring the shortest distance between two opposite sides. As illustrated in FIG. 5, the aperture ratio actual measurement value of the third sub pixel SP3 may be calculated by optically measuring at least one of the length L1 of the third sub pixel SP3 in the first direction DR1 of the emission area EA and the length L2 of the third sub pixel SP3 in the second direction DR2 of the emission area EA. For example, an aperture ratio actual measurement value of a pixel (for example, the length L1 of the third sub pixel SP3) used in a mobile display device may have a size of 24.67±1 [μm]. However, this is an example, and the aperture ratio actual measurement value of the pixel PX may be variously modified in correspondence with a type and a size of the display device.

However, the method of calculating the aperture ratio actual measurement value is not limited thereto. For example, the aperture ratio may be determined based on the area of the exposed portion of the first electrode E1 included in at least one of the sub pixels SP1, SP2, and SP3. That is, the area of the exposed portion of the first electrode E1 may be optically calculated, and the aperture ratio may be calculated by comparing the calculated value with a preset reference area.

When measuring the actual value of the aperture ratio with respect to all or a group of the mother substrates manufactured by the substrate manufacturing device 10, most reliable aperture ratio information may be obtained. However, because the actual aperture ratio measurement unit 21 performs an imaging with an imaging device such as a camera and measures the aperture ratio actual measurement value of the pixel PX included in the mother substrates, a lot of time and cost may occur. Therefore, a method of calculating the aperture ratio prediction value by actually measuring the aperture ratio only for some of sampled mother substrates of the plurality of mother substrates, calculating the aperture ratio actual measurement value of the pixel PX, and estimating the aperture ratio of the pixel PX for the remaining mother substrates through various methods may be considered.

For example, as the method of calculating the aperture ratio prediction value, single mean estimation, local mean estimation, a Gaussian process, and the like may be considered.

Referring to FIGS. 7A to 7C, the single mean estimation is a method of calculating an aperture ratio average of the pixel PX in a unit of the mother substrate and calculating the aperture ratio prediction value using the aperture ratio average. The local mean estimation is a method of obtaining an aperture ratio average of the pixel PX in an area unit (for example, the display panel) arbitrarily set in the mother substrate and calculating the aperture ratio prediction value using the aperture ratio average. The Gaussian process is a kind of supervised learning of machine learning, and is a method of learning using labeled data and estimating an output corresponding to the data when new data is input thereafter. That is, the Gaussian process is a method of outputting the aperture ratio prediction value by learning using the aperture ratio actual measurement value of the pixel PX and estimating the aperture ratio of the pixel PX.

The following Equation 1 is an equation configured to obtain an average (hereinafter, a first estimation scale) of a probability that a difference between an actual measurement value and a prediction value is within a tolerance range.

$$i/n\Sigma_{i=1}^{n} I(|y_i - \hat{y}_i| < \text{Allowable Error}) \quad \text{[Equation 1]}$$

Where, $y_i$ is the actually measured value, $\hat{y}_i$ is the prediction value, I is a function that outputs 1 when a condition is satisfied and outputs 0 when the condition is not satisfied.

FIG. 8A is a graph illustrating a result value of the first estimation scale for each of the single mean estimation, the local mean estimation, and the Gaussian process under a tolerance of 0.2 [μm]. When calculating the aperture ratio prediction value using the single mean estimation, the local mean estimation, and the Gaussian process, 0.59, 0.81, and 0.94 are derived as the first estimation scales, respectively. This means that accuracy of the aperture ratio prediction value compared to the aperture ratio actual measurement value corresponds to 59%, 80%, and 94%, respectively.

In addition, FIG. 8B is a graph illustrating a magnitude (hereinafter, second estimation scale) of an estimation error (that is, a degree at which an absolute error outside the tolerance range is different from an actual value) for each of the single mean estimation, the local mean estimation, and the Gaussian process. When calculating the aperture ratio prediction value using the single mean estimation, the local mean estimation, and the Gaussian process, 0.55 [μm], 0.39 [μm], and 0.30 [μm] are derived as the second estimation scales, respectively. This means that the error values are greater than the tolerance 0.2 [μm] by 0.35 [μm], 0.19 [μm], and 0.10 [μm], respectively.

That is, the accuracy of the calculation of the aperture ratio prediction value of the pixel PX using the single mean estimation method and the local mean estimation method may be less than that of the calculating of the aperture ratio prediction value of the pixel PX using the Gaussian process. Hereinafter, the estimation aperture ratio measurement unit 22 will be described with reference to FIGS. 9 to 11B, based on the Gaussian process and a gradient boosting model (gradient boosting machine), which is a method of calculating the aperture ratio prediction value with an accuracy higher than that of the Gaussian process, except for the single mean estimation method and the local mean estimation method having relatively low accuracy.

Referring to FIG. 9, the estimation aperture ratio measurement unit 22 may receive sensing data SD from the substrate manufacturing device 10 and an aperture ratio actual measurement value RM from the actual aperture ratio measurement unit 21, and may calculate an aperture ratio prediction value VM using the sensing data SD and the aperture ratio actual measurement value RM. The estimation aperture ratio measurement unit 22 may provide aperture ratio prediction values VM1 to VMn to the addition unit 23.

According to an embodiment of the disclosure, the estimation aperture ratio measurement unit 22 may calculate the aperture ratio prediction values VM1 to VMn of the pixel PX using a gradient boosting machine model. The gradient boosting model is a kind of machine learning, and is a learning method of obtaining an aperture ratio initial prediction value of the pixel PX by learning the sensing data SD received from the substrate manufacturing device 10, obtaining a gradient by differentiating a loss function for the prediction value, and reducing a prediction error using the gradient. At this time, the sensing data SD may be information on the process speed, the process temperature, the thickness of the photoresist, the temperature of the photoresist, and the exposure amount of the substrate manufacturing device 10 received from the substrate manufacturing device 10.

According to an embodiment of the disclosure, the estimation aperture ratio measurement unit 22 may calculate the aperture ratio prediction values VM1 to VMn using a plurality of machine learning models ML1 to MLn to improve accuracy of the aperture ratio prediction value compared to the aperture ratio actual measurement value. For example, each of the machine learning models ML1 to MLn may correspond to any one of extreme gradient boost (XG boost), categorical boosting (Cat boost), and light gradient boost machine (light GBM), which is an improved model of the above-described gradient boosting model. The extreme gradient boost (XG boost), the categorical boosting (Cat boost), and the light gradient boost machine (light GBM) are well-known technologies, and thus detailed description thereof is omitted.

According to an embodiment, the estimation aperture ratio measurement unit 22 may further include a Gaussian process model GP described above. The Gaussian process model GP may learn the sensing data SD received from the substrate manufacturing device 10 and the aperture ratio actual measurement value RM received from the actual aperture ratio measurement unit 21, and calculate an aperture ratio prediction value GPM. The calculated aperture ratio prediction value GPM may be provided to the addition unit 23.

Referring to FIG. 10, the addition unit 23 may include a reliability statistic calculation unit 23_1 that calculates a reliability statistic value based on the aperture ratio actual measurement value RM, a weight history management unit 23_2 that stores an average weight assigned to each of the machine learning models ML1 to MLn, a re-learning history management unit 23_3 that stores the number of re-learning of each of the machine learning models ML1 to MLn, a weight determination unit 23_4 that determines a weight of each of the machine learning models ML1 to MLn based on the reliability statistic value, the average weight, and the number of re-learning, and a re-learning discrimination unit 23_5 that discriminates whether to relearn each of the machine learning models ML1 to MLn based on the reliability statistic value, the average weight, and the number of re-learning.

According to an embodiment of the disclosure, the addition unit 23 may use an ensemble machine learning model. For example, the ensemble machine learning model may correspond to attention mechanism. That is, the ensemble machine learning model may be a method of giving weights (or attention values) to each of the aperture ratio prediction values VM and GPM calculated by the plurality of machine learning models ML1 to MLn and/or the Gaussian process model GP and then summing to calculate the final aperture ratio prediction value FEM. The addition unit 23 may provide the calculated final aperture ratio prediction value FEM to an outlier detection unit 24.

The accuracy of the aperture ratio prediction value of the machine learning models ML1 to MLn and/or the Gaussian process model GP may fluctuate due to a change of an environment, such as a model unique capability, a learning period, and reset of the aperture ratio measurement device 20. Therefore, the addition unit 23 may check a state of the machine learning models ML1 to MLn and/or the Gaussian process model GP and variably give the weight to the machine learning models ML1 to MLn and/or the Gaussian process model GP when calculating the final aperture ratio prediction value FEM.

According to an embodiment, the reliability statistic value calculation unit 23_1 may receive the aperture ratio actual measurement value RM from the actual aperture ratio measurement unit 21 and receive the aperture ratio prediction values VM and GPM from the estimation aperture ratio measurement unit 22. The reliability statistic calculation unit 23_1 may provide a higher reliability statistic value as the machine learning models ML1 to MLn having a less difference between the aperture ratio actual measurement value RM and the aperture ratio prediction value VM. The following Table 1 is a table in which the aperture ratio prediction values VM1 to VMn for the four machine learning models ML1 to ML4 illustrating a process of calculating the reliability statistic value are recorded for each substrate.

TABLE 1

|  | ML1 | ML2 | ML3 | ML4 | RM(μm) |
|---|---|---|---|---|---|
| Substrate 1 | 43.2 | 43.7 | 44.2 | 44.4 | 45.2 |
| Substrate 2 | 44.2 | 44.6 | 45.1 | 45.9 | |
| Substrate 3 | 42.3 | 42.5 | 43 | 43.4 | |
| Substrate 4 | 43.8 | 44.2 | 44.8 | 45 | 45.7 |
| Substrate 5 | 44.4 | 45 | 46 | 46.9 | |
| Substrate 6 | 43.1 | 43.6 | 43.7 | 44.1 | |
| Substrate 7 | 43.1 | 43.4 | 43.8 | 44.4 | 45 |
| Substrate 8 | 43.1 | 44 | 44.1 | 44.8 | |
| Substrate 9 | 43.1 | 43.7 | 44.7 | 45.2 | |

Referring to Table 1, the aperture value actual measurement value RM of the substrate 1 is 45.2 [μm]. Among four machine learning models ML1 to ML4, the aperture ratio prediction value VM4 of the fourth machine learning model ML4, 44.4 [μm], has the smallest error with the aperture ratio actual measurement value RM, 45.2 [μm], and an error with the aperture ratio actual measurement value RM may increase in a sequence of the aperture ratio prediction value VM3 of the third machine learning model ML3, 44.2 [μm], the aperture ratio prediction value VM2 of the second machine learning model ML2, 43.7 [μm], and the aperture ratio prediction value VM1 of the first machine learning model ML1, 43.2 [μm]. A result of analyzing the fourth substrate and the seventh substrate having obtained the aperture ratio actual measurement value RM are also the same as that of the first substrate. That is, an error compared to the aperture ratio actual measurement value RM increases in a sequence of the prediction value VM4 of the fourth machine learning model ML4, the prediction value VM3 of the third machine learning model ML3, the prediction value VM2 of the second machine learning model ML2, and the prediction value VM1 of the first machine learning model ML1. In this case, the reliability statistic calculation unit 23_1 may provide a higher reliability statistic value in a sequence of the machine learning model having the less difference between the aperture ratio actual value RM and the aperture ratio prediction value VM. That is, a higher reliability statistic value may be given in a sequence of the fourth machine learning model ML4, the third machine learning model ML3, the second machine learning model ML2, and the first machine learning model ML1.

In addition, when the learning periods of the plurality of machine learning models ML1 to MLn are different from each other, the reliability statistic value calculation unit 23_1 may give a higher reliability statistic value to the machine learning models ML1 to MLn having a longer learning period. A reference to give the high reliability statistic value by the reliability statistic value calculation unit 23_1 is not limited thereto.

The weight history management unit 23_2 may transmit and receive information with the weight determination unit 23_4 in two directions. The weight history management unit 23_2 may manage the weights that the weight determination unit 23_4 previously gives to each of the machine learning models ML1 to MLn and/or the Gaussian process model GP, as a database. For example, the weight history management unit 23_2 may calculate an average weight obtained by averaging the weights given to each of the machine learning models ML1 to MLn and/or the Gaussian process model GP.

The re-learning history management unit 23_3 may transmit and receive information with the re-learning discrimination unit 23_5 in two directions. The re-learning history management unit 23_3 may manage the number of times re-learning discrimination unit 23_5 previously instructs each of the machine learning models ML1 to MLn and/or the Gaussian process model GP to re-learn, as a database.

The weight determination unit 23_4 may give a higher weight to a machine learning model having a greater reliability statistic value, a greater average weight, and a less number of re-learning.

When describing using Table 1 as an example, in a case the average weight and the number of re-learning of each of the first to fourth machine learning models ML1 to ML4 are the same, the highest weight (or attention value) may be given to the fourth machine learning model ML4 having the greatest reliability statistic value. In addition, a size of the given weight may decrease in a sequence of the third machine learning model ML3, the second machine learning model ML2, and the first machine learning model ML1. For example, the weight determination unit 23_4 may give a weight of 0.4 to the fourth machine learning model ML4, give a weight of 0.3 to the third machine learning model ML3, give a weight of 0.2 to the second machine learning model ML2, and give a weight of 0.1 to the first machine learning model ML1.

Therefore, the aperture ratio measurement device 20 may concentrate on the machine learning model ML that calculates the aperture ratio prediction value VM that is most similar to the aperture ratio actual measurement value RM, and thus that accuracy of prediction may be improved.

Meanwhile, the re-learning discrimination unit 23_5 may give a less re-learning chance as the machine learning model ML having the greater reliability statistic value, the greater average weight, and the less number of re-learning. When describing using Table 1 as an example, in a case the average weights and the number of re-learning of each of the first to fourth machine learning models ML1 to ML4 are the same, the re-learning discrimination unit 23_5 according to an embodiment may instruct the first machine learning model ML1 having the lowest reliability statistic value to re-learn.

The outlier detection unit 24 may detect an outlier that is a value exceeding a preset range among the final aperture ratio prediction values FEM, and calculate the final aperture ratio prediction value FEM' from which the outlier is removed. The outlier detection unit 24 may use a machine learning model of any one of stacked auto encoder, sparse auto encoder, and denoising auto encoder. The outlier detection unit 24 may provide the final aperture ratio prediction value FEM' from which the outlier is removed to a first database 25.

Referring to FIG. 4 again, the manufacturing device 30 of the display device may include a second database 31 and a driving signal device 32. The second database 31 may receive the aperture ratio actual measurement value RM from the actual aperture ratio measurement unit 21, and may receive the final aperture ratio prediction value FEM' from which the outlier is removed from the first database 25 of the aperture ratio measurement device 20. According to an embodiment, the manufacturing device 30 of the display device may provide the final aperture ratio prediction value FEM' from which the outlier is removed to the deterioration compensation unit 200 of the display device DD (refer to FIG. 3). However, the final aperture ratio prediction value FEM' from which the outlier is removed may be provided to the display panel 100 according to a progress state of the process.

Therefore, the display device DD may additionally apply a compensation factor reflecting the aperture ratio deviation to the deterioration compensation data CDATA by the deterioration compensation unit 200. Thus, the lifespan curve deviation between the pixels PX or the display panels 100 due to the aperture ratio deviation may be improved, and the lifespan curves may be corrected to correspond to the target lifespan curve. Therefore, application of an afterimage compensation (deterioration compensation) algorithm based on a luminance reduction may become easy.

For convenience of description, the estimation aperture ratio measurement unit 22, the addition unit 23, the outlier detection unit 24, and the first database 25 have been described as configurations included in the aperture ratio measurement device 20, but are not limited thereto. For example, the estimation aperture ratio measurement unit 22, the addition unit 23, the outlier detection unit 24, and the first database 25 may be configured as an estimation aperture ratio measurement device separately from the actual aperture ratio measurement unit 21. The estimation aperture ratio measurement device may be a computing device such as a personal computer (PC).

Figure 11B:
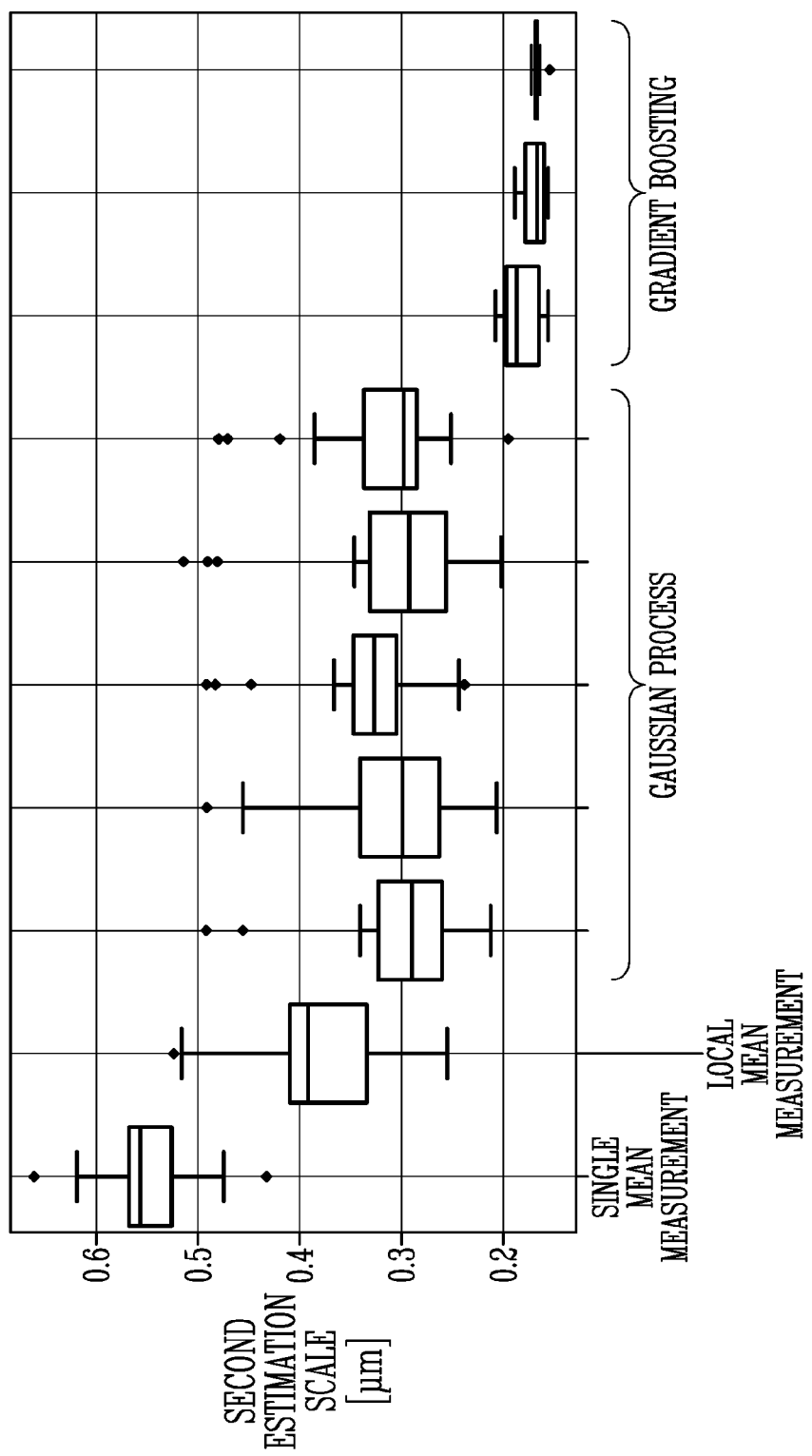

FIGS. 11A and 11B are diagrams illustrating an effect of the gradient boosting model (gradient boosting machine).

FIG. 11A is a graph illustrating a result of the first estimation scale for each of the single mean estimation, the local mean estimation, the Gaussian process, and the gradient boosting model. When calculating the aperture ratio prediction value using the single mean estimation, the local mean estimation, the Gaussian process, and the gradient boosting mode, 0.59, 0.81, 0.94, and 0.99 are derived as the first estimation scales, respectively. This means that accuracy of the aperture ratio prediction value compared to the aperture ratio actual measurement value corresponds to 59%, 80%, 94%, and 99%, respectively. When the aperture ratio prediction value is calculated using the gradient boosting model, more accurate prediction value calculation may be expected than the single mean estimation and the local mean estimation.

In addition, FIG. 11B is a graph illustrating a magnitude (hereinafter, second estimation scale) of an estimation error (that is, a degree at which an absolute error outside the tolerance range is different from an actual value) for each of the single mean estimation, the local mean estimation, the Gaussian process, and the gradient boosting mode. When calculating the aperture ratio prediction value using the single mean estimation, the local mean estimation, the Gaussian process, and the gradient boosting mode, 0.55 [μm], 0.39 [μm], 0.30 [μm], and 0.13 [μm] are derived as the second estimation scales, respectively. This means that an estimation error of the single mean estimation, the local mean estimation, and the Gaussian process have error values greater than the tolerance 0.2 [μm] by 0.35 [μm], 0.19 [μm], and 0.10 [μm], respectively. On the other hand, an estimation error of the gradient boosting model may have a less error value by 0.07 [μm] than the tolerance 0.2 [μm], and thus when calculating the aperture ratio prediction value using the gradient boosting model, an effect that a degree at which the absolute error outside the tolerance range is different from the actual value decreases may be expected.

Although the disclosure has been described with reference to the embodiments thereof, it will be understood by those skilled in the art that the disclosure may be variously modified and changed without departing from the spirit and scope of the disclosure disclosed in the following claims.

What is claimed is:

1. An aperture ratio measurement device comprising:
   an actual aperture ratio measurement unit that images a quantity of mother substrates selected from a plurality of mother substrates and calculates an aperture ratio actual measurement value of a pixel for the imaged quantity of mother substrates;
   an estimation aperture ratio measurement unit that learns sensing data for each of the plurality of mother substrates and calculates an aperture ratio prediction value of a pixel for a group of the plurality of mother substrates; and
   an addition unit which calculates a final aperture ratio prediction value based on the aperture ratio actual measurement value and the aperture ratio prediction value.

2. The aperture ratio measurement device according to claim 1, wherein the sensing data comprises:
   at least one of a process speed, a process temperature, a photoresist thickness, a photoresist temperature, and an exposure amount of a substrate manufacturing device manufacturing the plurality of mother substrates.

3. The aperture ratio measurement device according to claim 1, wherein an aperture ratio of the pixel is a ratio of an area of an emission area of the pixel to a total area of the pixel.

4. The aperture ratio measurement device according to claim 3, wherein the aperture ratio of the pixel is calculated based on a shortest distance between two opposing sides when the emission area has a quadrangle shape.

5. The aperture ratio measurement device according to claim 1, wherein the estimation aperture ratio measurement unit calculates the aperture ratio prediction value using a plurality of machine learning models.

6. The aperture ratio measurement device according to claim 5, wherein the plurality of machine learning models comprise:
   extreme gradient boost (XG boost), categorical boosting (Cat boost), and light gradient boost machine (light GBM).

7. The aperture ratio measurement device according to claim 5, wherein the addition unit gives a weight to each aperture ratio prediction value calculated by the plurality of machine learning models, using an ensemble machine learning model, and adds each aperture ratio prediction value.

8. The aperture ratio measurement device according to claim 7, wherein the ensemble machine learning model comprises:
   a reliability statistic value calculation unit that calculates a reliability statistic value based on the aperture ratio actual measurement value, a weight history management unit that stores an average weight to give to each of the machine learning models, and a re-learning history management unit that stores a quantity of re-learning of each of the machine learning models.

9. The aperture ratio measurement device according to claim 8, wherein the reliability statistic calculation unit gives a higher reliability statistic value to a machine learning model having a smaller difference between the aperture ratio actual measurement value and the aperture ratio prediction value.

10. The aperture ratio measurement device according to claim 8, wherein the reliability statistic value calculation unit gives a higher reliability statistic value to the machine learning model having a longer learning period when learning periods of the plurality of machine learning models (ML1 to MLn) are different from each other.

11. The aperture ratio measurement device according to claim 8, wherein the ensemble machine learning model comprises:
   a weight determination unit that determines a weight of each of the machine learning models based on the reliability statistic value, the average weight, and the number of re-learning; and
   a re-learning discrimination unit that discriminates whether to re-learn each of the machine learning models based on the reliability statistic value, the average weight, and the quantity of re-learning.

12. The aperture ratio measurement device according to claim 11, wherein the weight determination unit gives a higher weight to a machine learning model having the greater reliability statistic value, the greater average weight, and the less quantity of re-learning.

13. The aperture ratio measurement device according to claim 11, wherein the re-learning discrimination unit gives a less re-learning opportunity to the machine learning model having the greater reliability statistic value, the greater average weight, and the less quantity of re-learning.

14. The aperture ratio measurement device according to claim 1, further comprising:
   an outlier detection unit which detects an outlier that is a value exceeding a preset range among the final aperture ratio prediction values.

15. The aperture ratio measurement device according to claim 14, wherein the outlier detection unit uses a machine learning model of any one of stacked auto encoder, sparse auto encoder, and denoising auto encoder.

16. A deterioration compensation system of a display device, the deterioration compensation system comprising:
   a substrate manufacturing device that manufactures mother substrates including a plurality of display panels;
   an aperture ratio measurement device that calculates a final aperture ratio prediction value of a pixel included in the mother substrates; and
   a manufacturing device of the display device, which inputs the final aperture ratio prediction value to each of the display panels,
   wherein the aperture ratio measurement device comprises:
   an actual aperture ratio measurement unit that images a quantity of mother substrates selected from the mother substrates and calculates an aperture ratio actual measurement value of a pixel for the imaged quantity of mother substrates;
   an estimation aperture ratio measurement unit which learns sensing data for each of the mother substrates and calculates the aperture ratio prediction value of a pixel for a group of the mother substrates; and
   an addition unit which calculates the final aperture ratio prediction value based on the aperture ratio actual measurement value and the aperture ratio prediction value.

17. The deterioration compensation system of the display device according to claim 16, wherein the sensing data comprises:
   at least one of a process speed, a process temperature, a photoresist thickness, a photoresist temperature, and an exposure amount of the substrate manufacturing device.

18. The deterioration compensation system of the display device according to claim 16, wherein an aperture ratio of the pixel is a ratio of an area of an emission area of the pixel to a total area of the pixel.

19. The deterioration compensation system of the display device according to claim 16, wherein the estimation aperture ratio measurement unit calculates the aperture ratio prediction value using a plurality of machine learning models.

20. The deterioration compensation system of the display device according to claim 19, wherein the addition unit gives a weight to each aperture ratio prediction value calculated by the plurality of machine learning models, using an ensemble machine learning model, and adds each aperture ratio prediction value.

* * * * *